United States Patent [19]

Piao

[11] Patent Number: 5,566,445
[45] Date of Patent: Oct. 22, 1996

[54] IC MOUNTING TOOL

[76] Inventor: Tseng S. Piao, P.O. Box 82-144, Taipei, Taiwan

[21] Appl. No.: 330,823
[22] Filed: Oct. 24, 1994
[51] Int. Cl.$^6$ .................................................. H05K 13/04
[52] U.S. Cl. ................................. 29/741; 29/758; 29/764
[58] Field of Search ............................... 29/741, 758, 764

[56] References Cited

U.S. PATENT DOCUMENTS 4,873,761  10/1989  Korsunsky et al. ...................... 29/741
4,879,806  11/1989  Feng ........................................ 29/741

*Primary Examiner*—Carl E. Hill
*Attorney, Agent, or Firm*—Alfred Lei

[57] ABSTRACT

An IC mounting tool including a substantially arched spring plate having two opposite ends bilaterally horizontally extended outwards and formed into two opposite horizontal bearing sections and then into two opposite vertical tip sections, and two movable pawls inserted through the in vertical sliding slots of the vertical tip sections, wherein when the IC mounting tool is used to install an IC in an IC connector, the movable pawls are forced upwards to receive the keys thereof in respective slots of the horizontal bearing sections; when the IC mounting tool is used to remove an IC from an IC connector, the key of each movable pawl is extended out of the respective vertical tip section and clamped on the bottom side of the IC permitting the IC to be removed out of the IC connector when the IC mounting tool is pulled upwards.

3 Claims, 6 Drawing Sheets

IC MOUNTING TOOL

BACKGROUND OF THE INVENTION

The present invention relates to an IC mounting tool which can be conveniently used to install an IC in a circuit board or remove an IC from a circuit board.

When to install an IC in a circuit board or to remove an IC from a circuit board, a specific tool such as an IC transplanting tool or IC puller shall be used. Because IC mounting and dismounting procedures may have to be alternatively performed during the work, two different tools, namely, an IC transplanting tool and an IC puller should be prepared and alternatively used. If to install an IC in a circuit board or to remove an IC from a circuit board by hands, the IC may be damaged easily by the static charge carried on the hands.

SUMMARY OF THE INVENTION

The present invention has been accomplished under the circumstances in view. It is one object of the present invention to provide an IC mounting tool which can be used as an IC transplanting tool as well as an IC puller. It is another object of the present invention to provide an IC mounting tool which is comprised of a substantially arched spring plate and two movable pawls inserted through the vertical sliding slots of the two opposite vertical tip sections of the spring plate, which movable pawls have a respective key that is moved out of the respective vertical tip section when the IC mounting tool is used as an IC puller or concealed inside the respective slot on a respective horizontal bearing section of the spring plate when the IC mounting tool is used as an IC puller.

Other objects of the invention will in part be obvious and in part hereinafter pointed out.

The invention accordingly consists of features of constructions and method, combination of elements, arrangement of parts and steps of the method which will be exemplified in the constructions and method hereinafter disclosed, the scope of the application of which will be indicated in the claims following.

DETAILED DESCRIPTION OF THE PREFERRED EMBODIMENT

Figure 1:
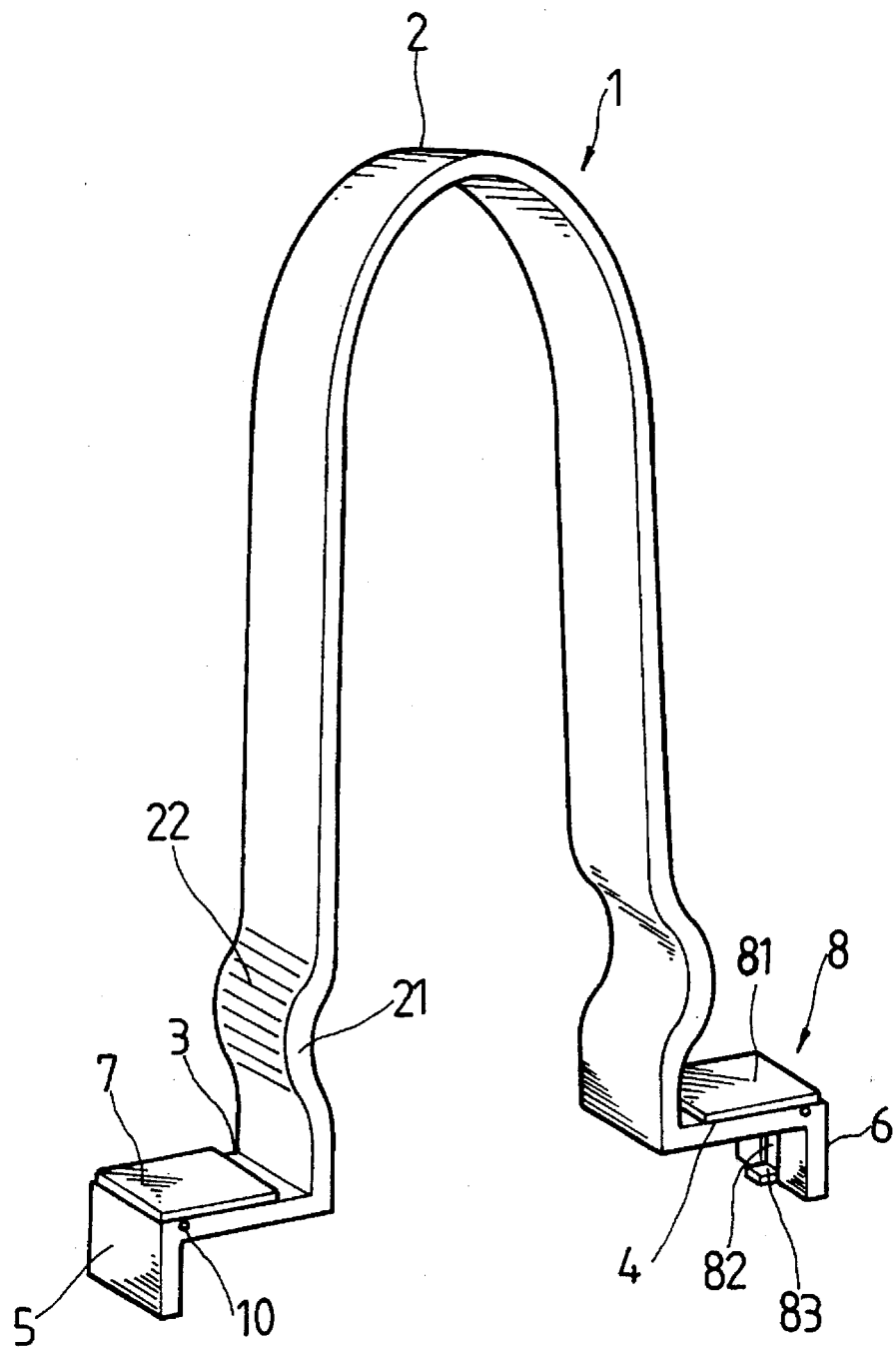
FIG. 1 is an elevational view of an IC mounting tool according to the present invention.
Figure 2A:
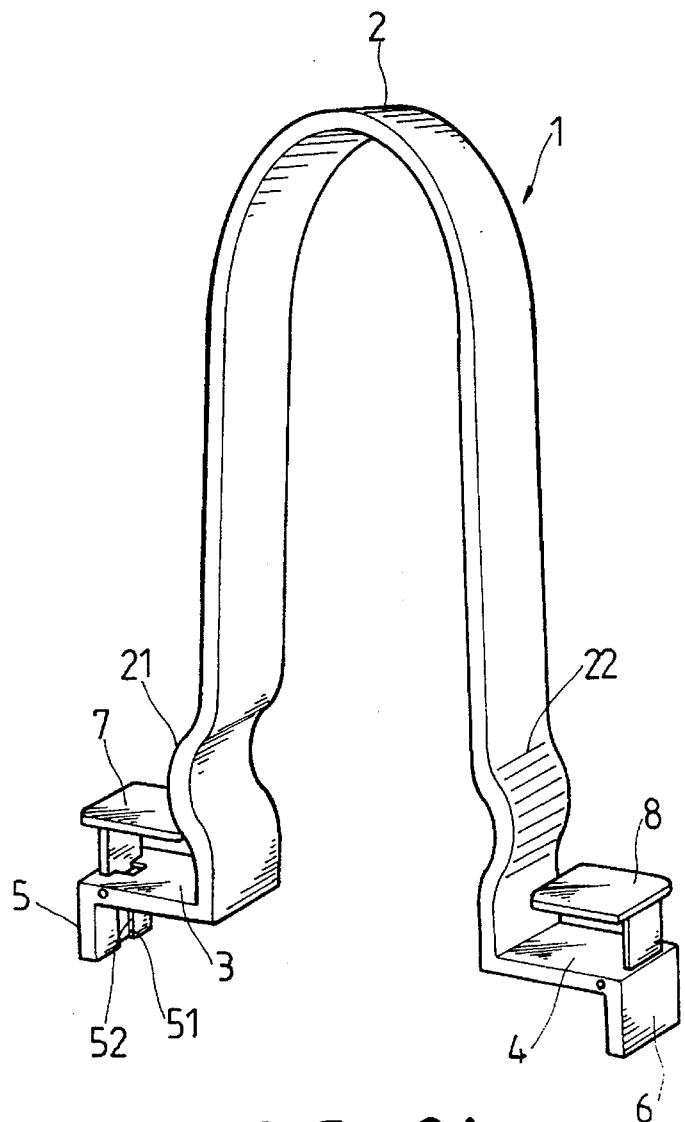
FIG. 2A is similar to FIG. 1 but showing the movable pawls moved to the upper limit.
Figure 2B:
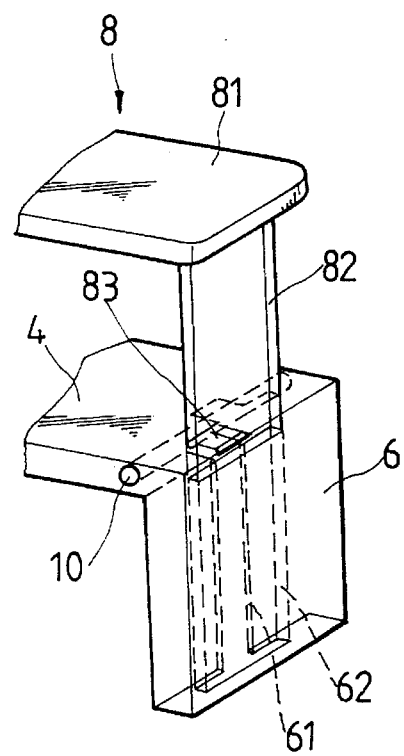
FIG. 2B is a perspective view in an enlarged scale of part of FIG. 2.

For purpose to promoting an understanding of the principles of the invention, reference will now be made to the embodiment illustrated in the drawings. Specific language will be used to describe same. It will, nevertheless, be understood that no limitation of the scope of the invention is thereby intended, such alternations and further modifications in the illustrated device, and such further applications of the principles of the invention as illustrated herein being contemplated as would normally occur to one skilled in the art to which the invention relates.

Figure 3C:
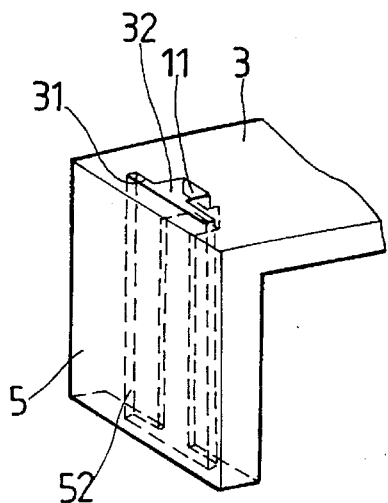
FIG. 3C is similar to FIG. 3B but showing a raised stop portion made inside the short longitudinal slot of the horizontal bearing section of the spring plate to replace the stop rod of FIG. 3B.
Figure 3A:
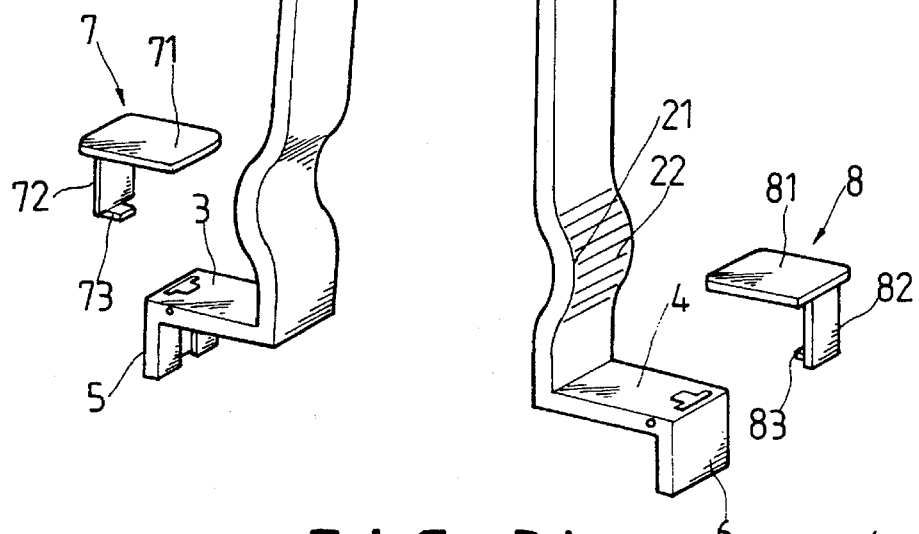
FIG. 3A is a exploded view of the IC mounting tool of FIG. 1.
Figure 3B:
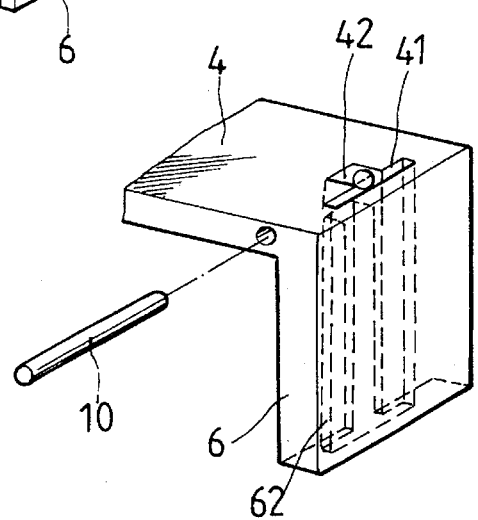
FIG. 3B is a perspective view in an enlarged scale of part of FIG. 3.
Figure 4:
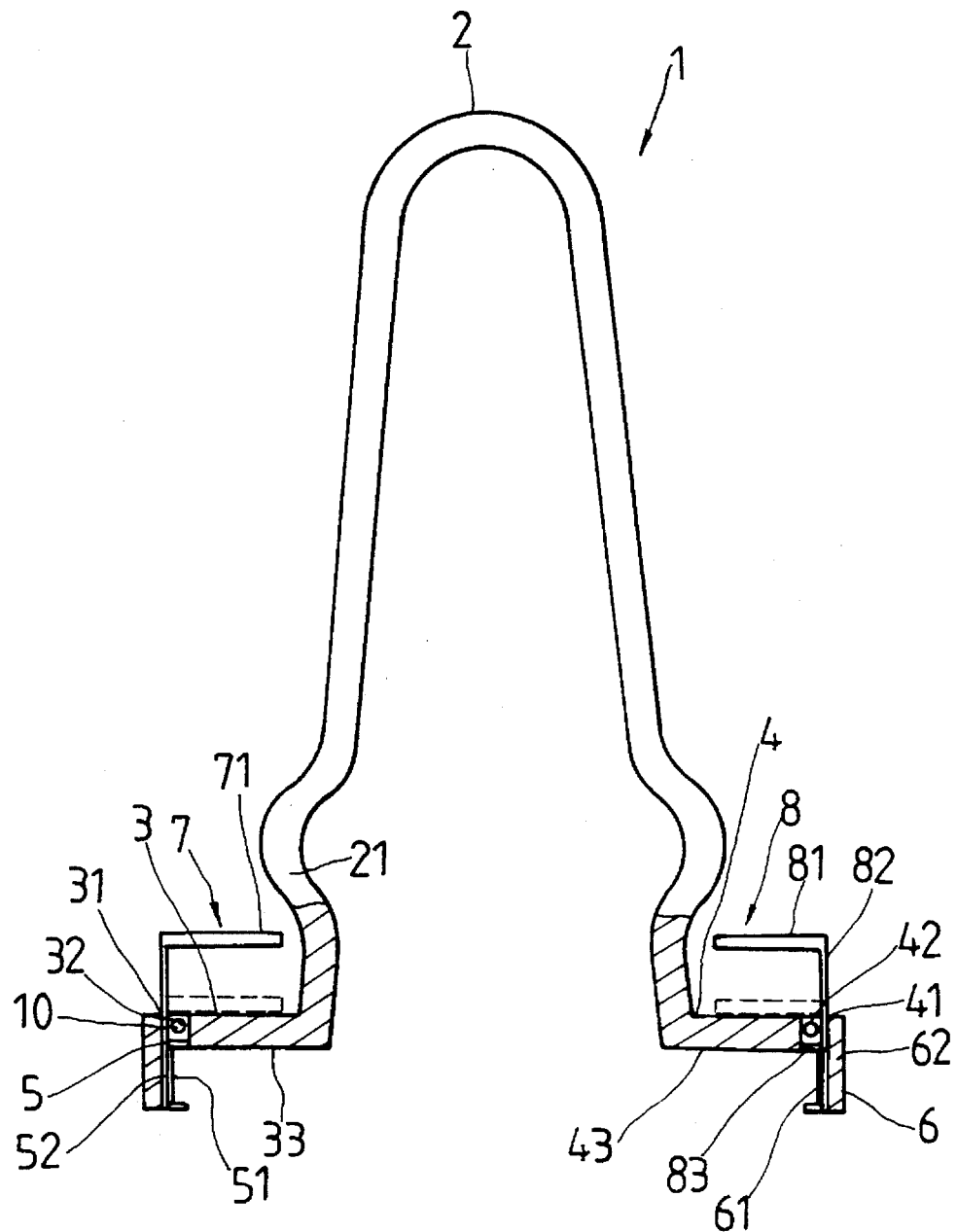
FIG. 4 is a longitudinal view in section of FIG. 2.

Referring to FIG. 3, an IC mounting tool, referenced by 1, comprises a substantially arched spring plate 2, two movable pawls 7 and 8, and two stop rods 10.

Referring to FIGS. 1 through 4, the spring plate 2 has two opposite ends bilaterally horizontally extended outwards and formed into two horizontal bearing sections 3 and 4, and then vertically extended downwards and formed into two vertical tip sections 5 and 6. The horizontal bearing section 3 or 4 comprises a long transverse slot 31 or 41, a short longitudinal slot 32 or 42 extended from the long transverse slot 31 or 41 in the middle, and a flat bottom surface 33 or 43. The vertical tip section 5 or 6 comprises a vertical sliding slot 52 or 62 extended to the long transverse slot 31 or 41, and a vertical guiding slot 51 or 61 communicated with the vertical sliding slot 52 or 62 and extend the short longitudinal slot 32 or 42. The movable pawl 7 or 8 comprises a flat base 71 or 81, a sliding block 72 or 82 integrally extended from the flat base 71 or 81, and a key 73 or 83 raised from the sliding block 72 or 82 at an inner side. The stops 10 are respectively fastened to the horizontal bearing sections 3 and 4 and disposed in the short longitudinal slots 32 and 42 at the top. During the assembly process, the sliding blocks 72 and 82 of the movable pawls 7 and 8 are respectively inserted through the long transverse slots 31 and 41 into the vertical sliding slots 52 and 62, permitting the keys 73 and 83 to be moved in the vertical guide slots 51 and 61. When installed, the movable pawls 7 and 8 can be moved vertically along the vertical sliding slots 52 and 62. When the movable pawls 7 and 8 are moved upwards, the keys 73 and 83 will be stopped by the stop rods 10, and therefore the movable pawls 7 and 8 do not disconnect from the spring plate 2. Instead of the stop rods 10, a raised portions 11 may be integrally made on the horiz bearing section 3 or 4 inside the short longitudinal slot 32 or 42 (see FIG. 3C) to stop the key 73 or when the movable pawl 7 or 8 is moved to the limit.

Referring to FIGS. 1 through 3 again, the spring plate 2 has two outwardly curved sections 21 near the horizontal bearing sections 3 and 4, and embossed transverse stripes 22 on the outwardly curved sections 21 at an outer side. Through the outwardly curved sections 21, the spring plate 2 can be squeezed by fingers to move the vertical tip sections 5 and 6 toward each other.

Figures 5A, 5B:
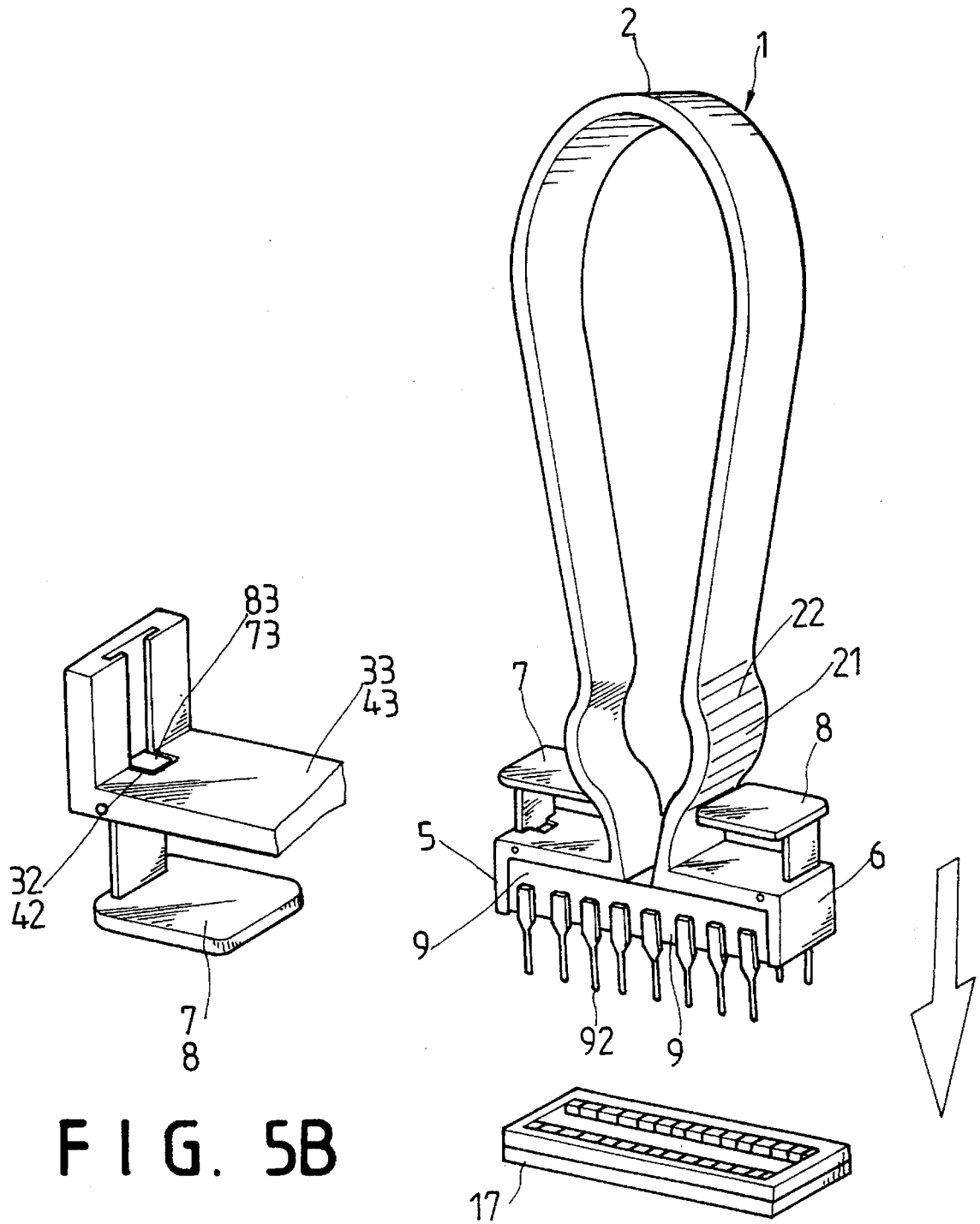
FIG. 5A is an applied view of the present invention, showing an IC clamped by the IC mounting for installation.
FIG. 5B is a bottom view of part of FIG. 5A, showing the key of the movable pawl received within the short longitudinal slot of the horizontal bearing section of the spring plate.

FIGS. 5A and 5B show the IC mounting tool used as an IC transplanting tool and operated to fasten an IC 9 to an IC connector 17. When the curved sections 21 of the spring plate 2 is squeezed inwards to move the vertical tip sections 5 and 6 toward each other to hold the IC 9, the movable pawls 7 and 8 are simultaneously forced upwards by the IC 9, causing the keys 73 and 83 received in the short longitudinal slots 42 beneath the stop rods 10 (or the raised stop portions 11). When the IC 9 is moved to the IC connector 17, the spring plate 2 is forced downwards, causing the flat bottom surfaces 33 and 43 of the horizontal bearing sections 3 and 4 to force the contacts 92 of the. IC 9 into respective contact holes in the IC connector 17. When installed, the spring plate 2 is released from the IC 9.

Figure 6:
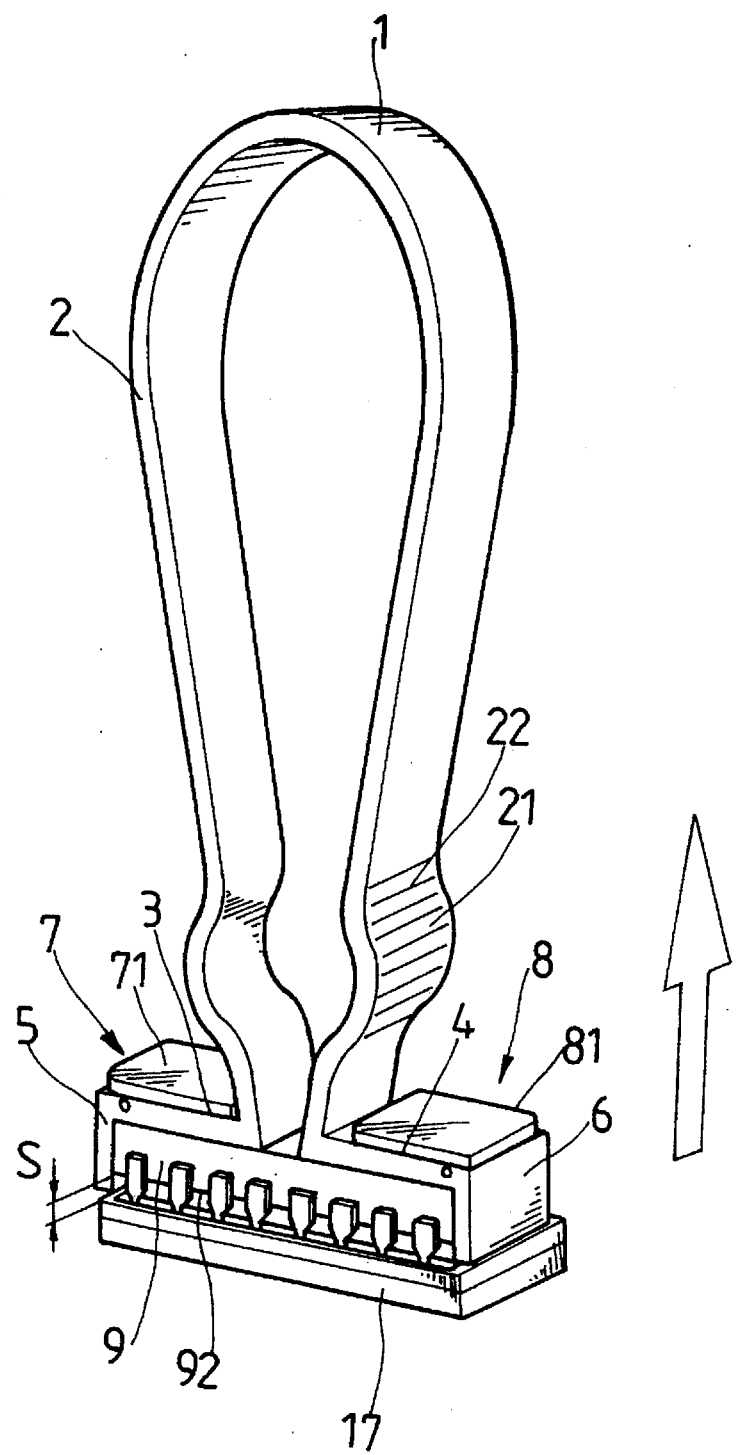
FIG. 6 is another applied view of the present invention, showing the movable pawls of the IC mounting tool clamped on the IC and pulled upwards to remove the IC from the IC connector.

FIG. 6 shows the IC mounting tool used as an IC puller and operated to remove the IC 9 from the IC connector 17. When the spring plate 2 is attached to the IC 9, the outwardly curved sections 21 are squeezed to move the vertical tip sections 5 and 6 inwards toward, causing the keys 73 and 83 of the movable pawls 7 and 8 forced by the vertical tip sections 5 and 6 into the gap S between the IC 9 and the IC connector 17 and clamped on the flat bottom surface 91 of the IC 9 from two opposite sides. At the same time, the flat bases 71 and 81 of the movable pawls 7 and 8 are stopped above the horizontal bearing sections 3 and 4. Therefore, the IC 9 can be smoothly removed from the IC connector 17 when the spring plate 2 is pulled vertically upwards.

The invention is naturally not limited in any sense to the particular features specified in the forgoing or to the details of the particular embodiment which has been chosen in order to illustrate the invention. Consideration can be given to all kinds of variants of the particular embodiment which has been described by way of example and of its constituent elements without thereby departing from the scope of the invention. This invention accordingly includes all the means constituting technical equivalents of the means described as well as their combinations.

I claim:

1. An IC mounting tool comprising:

a substantially arched spring plate having two opposite ends bilaterally horizontally extended outwards and formed into two opposite horizontal bearing sections and then into two opposite vertical tip sections, said horizontal bearing sections each having a transverse slot and a longitudinal slot perpendicularly extended from said transverse slot in the middle, said vertical tip sections each having a sliding slot and a guide slot;

two movable pawls respectively inserted through the vertical sliding slot of said vertical tip sections, each movable pawl having a horizontal base disposed above one horizontal bearing section and a vertical sliding block extended from said horizontal base at right angles and inserted through the transverse slot on the respective horizontal bearing section into the vertical sliding slot on the respective vertical tip section, the vertical sliding block of each movable pawl having an outward key horizontally disposed at an inner side; and stop rods respectively disposed in the transverse slots of said horizontal bearing sections to limit upward movement of said movable pawls and to stop them from escaping out of the vertical sliding slots of said vertical tip sections; and wherein when said movable pawls are moved upwards, the keys of said vertical sliding blocks are respectively received in the longitudinal slots of said horizontal bearing sections, permitting said horizontal bearing sections to be pressed on the IC to be installed and permitting said vertical tip sections to be moved toward each other and clamped on two opposite vertical lateral sides of the IC to be installed; when said movable pawls are moved downwards with the horizontal base of each movable pawl stopped above the respective horizontal bearing section, the key of the sliding block of each movable pawl is extended out of the respective vertical tip section for removing an IC from an IC connector.

2. The IC mounting tool as claimed in claim 1 wherein said stop rods are respectively integrally raised from peripheral walls of the longitudinal slots of said horizontal bearing sections.

3. The IC mounting tool as claimed in claim 1 wherein said spring plate comprises two outwardly curved sections respectively disposed near said horizontal bearing sections, and embossed transverse stripes on said outwardly curved sections at an outer side for the holding of the fingers.

* * * * *